United States Patent
Keith

(10) Patent No.: US 7,847,715 B2
(45) Date of Patent: Dec. 7, 2010

(54) SEGMENTED OPTICS CIRCUIT DRIVE FOR CLOSED LOOP FIBER OPTIC SENSORS

(75) Inventor: Gregg Keith, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 23 days.

(21) Appl. No.: 12/185,428

(22) Filed: Aug. 4, 2008

(65) Prior Publication Data

US 2010/0026535 A1    Feb. 4, 2010

(51) Int. Cl.
    *H03M 1/00*    (2006.01)
(52) U.S. Cl. ............... 341/132; 341/144; 341/155
(58) Field of Classification Search ........... 341/155, 341/137, 143, 144, 159
    See application file for complete search history.

(56) References Cited

U.S. PATENT DOCUMENTS

| | | |
|---|---|---|
| 5,351,123 A * | 9/1994 | Spahlinger ............ 356/464 |
| 5,999,304 A | 12/1999 | Sanders et al. |
| 6,191,721 B1 | 2/2001 | Johnson et al. |
| 6,396,801 B1 * | 5/2002 | Upton et al. ............ 370/204 |
| 6,549,155 B1 * | 4/2003 | Heminger et al. ........ 341/144 |
| 6,744,519 B2 | 6/2004 | Lange et al. |
| 6,748,141 B2 * | 6/2004 | Kennedy et al. ............ 385/49 |
| 7,256,384 B2 * | 8/2007 | Gottesman et al. ...... 250/214 C |
| 7,430,488 B2 * | 9/2008 | Otani ..................... 702/127 |

* cited by examiner

*Primary Examiner*—Peguy JeanPierre
(74) *Attorney, Agent, or Firm*—Fogg & Powers LLC

(57) ABSTRACT

Systems and methods for improving output resolution of an optical drive circuit in an optical sensor. The optical sensor circuit includes an optics circuit that generates analog measurement data, a detector circuit that detects the analog measurement data and converts the analog measurement data to a digital measurement data, and a signal processing circuit that demodulates the digital measurement data and generates a segmented digital signal based on the demodulated digital measurement data. The optical sensor circuit further includes an optics drive circuit that generates an analog drive signal based on the segmented digital signal. The analog drive signal is then used to drive the optical circuit.

10 Claims, 4 Drawing Sheets

SEGMENTED OPTICS CIRCUIT DRIVE FOR CLOSED LOOP FIBER OPTIC SENSORS

FIELD OF THE INVENTION

The present invention generally relates to gyro systems, and more particularly to modulating optical signals in interferometric fiber optic gyros (IFOGs).

BACKGROUND OF THE INVENTION

Gyros have been used to measure rotation rates or changes in angular velocity about an axis of rotation. A basic conventional fiber optic gyro (FOG) includes a light source, a beam generating device, and a coil of optical fiber coupled to the beam generating device that encircles an area about a sensing axis. The beam generating device transmits light beams into the coil that propagate in a clockwise (CW) direction and a counter-clockwise (CCW) direction along the core of the optical fiber and both ultimately impinge on a photodetector (e.g., a photodiode electrically coupled to a photodetection system). Many FOGs utilize glass-based optical fibers that conduct light along a solid glass core of the fiber. The two counter-propagating (e.g., CW and CCW) beams experience different optical path lengths while propagating around a rotating closed optical path or loop. For example, rotation about the sensing axis increases the optical path length in one rotational direction and decreases the optical path length in the other rotation direction. The difference in the two optical path lengths introduces a phase shift between the light beams for either rotation direction (i.e., the Sagnac effect), and this difference is proportional to the rotational rate that is normal to the enclosed area.

The phase difference between the counter-propagating light beams in the loop is typically modulated to increase sensitivity to rotation detection using an optical phase modulator coupled with a bias signal generator. The optical phase modulator may be operated in a feedback loop from the photodetection system to provide sufficient negative feedback for canceling the phase shift difference, between the counter-propagating light beams, resulting from a rotation about the sensing axis. In one example, a phase-sensitive detector receives a signal representing the photodetector output current and provides an indication of the relative phase of the light beams impinging on the photodetector. Any significant signal content recovered by the phase-sensitive detector at the modulation frequency is proportional to the rotation rate.

The signal from the phase-sensitive detector may be used to phase shift one light beam relative to the other beam to bring the counter-propagating beams in phase with each other. For example, the signal from the phase-sensitive detector may be supplied to servo electronics having an accumulator, such as an integrator. In response to the phase differences generated during rotation, the servo electronics supplies a signal to phase shift one light beam relative to the other beam. In digital implementations of the feedback loop, an analog-to-digital converter (ADC) converts the analog output of the photodetector to a digital equivalent (e.g., for use by the phase-sensitive detector), and a digital-to-analog converter (DAC) converts the digital signal from the servo electronics to an analog signal for phase shifting via the optical phase modulator.

At very low rotation rates and near zero degrees phase detection, plus or minus some pre-determined value, the gyroscope is generally less sensitive to phase detection. This region is referred to as a "deadband," and deadband errors may occur for a number of reasons. One source of deadband results from the truncation of digital signals from the servo electronics to lower bit values prior to supplying the digital signal to the DAC. This truncation can also introduce an asymmetry that, in the presence of vibration, could rectify into rate error. Additionally, loop error may take a significant amount of time to converge to the appropriate phase shift, and this time for convergence may be further extended with the truncation of signals supplied to the DAC.

Closed-loop optical sensors, such as the fiber optic gyros discussed above, typically contain an Integrated Optics Circuit (IOC) modulation component that is driven with a 12 to 16 bit truncated signal received from a single high resolution Digital to Analog Converter (DAC). The resolution metrics of these sensors are substantially limited by the data truncation associated with the use of only one high resolution DAC in the IOC drive component of the sensors. In high precision applications, these truncated signals can cause undesirable deadband errors. For example, the least significant bit of a 12-bit resolution DAC scales to a several hundreds of degrees per hour bias error. Even though over a long period of time the closed-loop architecture maintains a bias error which averages to zero, quantization error remains in terms of angle white noise.

One solution utilized to improve bit resolution in closed loop fiber optic gyros is to employ a higher resolution DAC in the IOC drive. Unfortunately, these high resolution converters are expensive and still require truncation well below 23-bit resolution. Another solution utilized to reduce truncation error associated with the use of a single DAC in the IOC drive circuit of fiber optic gyros is to implement a technique that introduces noise and averaging to the signal processing or drive components. Unfortunately, such techniques invariably inject certain unwanted noise into the converter component. This unwanted noise can lead to inconsistent sensor output and decreased system throughput.

Accordingly, it is desirable to provide a closed-loop optical sensor that decreases closed-loop errors. Furthermore, other desirable features and characteristics of the present invention will become apparent from the subsequent detailed description of the invention and the appended claims, taken in conjunction with the accompanying drawings and this background of the invention.

SUMMARY OF THE INVENTION

The present invention provides systems and methods for improving the output resolution of an optical drive circuit in an optical sensor system. An example optical sensor system includes an optics circuit that generates analog measurement data, a detector circuit that detects the analog measurement data and then converts the analog measurement data to a digital measurement data, a signal processing circuit that demodulates the digital measurement data and then generates a segmented digital signal based on the demodulated digital measurement data, and an optics drive circuit that generates an analog drive signal based on the segmented digital signal, wherein the analog drive signal is used to drive the optical circuit.

In accordance with other aspects of the invention, the optics drive component includes a first converter that converts a first digital data segment of the segmented digital signal to a first analog data segment and a second converter that converts a second digital data segment of the segmented digital signal to a second analog data segment.

In accordance with further aspects of the invention, the first digital data segment corresponds to more significant bits of data than the second digital data segment.

In accordance with further aspects of the invention, the optical drive circuit is further amplifies the first and second analog data segments and then combines the amplified analog data segments into a single analog drive signal.

In accordance with yet other aspects of the invention, the generated analog drive signal of the optical drive circuit has greater resolution than the first converter.

In accordance with still another aspect of the invention, the generated digital measurement data and the analog drive signal correspond to data with at least 16-bit resolution.

As will be readily appreciated from the foregoing summary, the invention provides means for improving the output resolution of an optical drive component in an optical sensor.

BRIEF DESCRIPTION OF THE DRAWINGS

Preferred and alternative embodiments of the present invention are described in detail below with reference to the following drawings.

DETAILED DESCRIPTION OF THE INVENTION

The present invention relates to a system and method for improving the output resolution of an optical drive circuit in an optical sensor device. In accordance with at least one embodiment, the output bit resolution of an optical drive circuit can be significantly increased by segmenting data conversion between two distinct converter components in the optical drive circuit.

Figure 1:
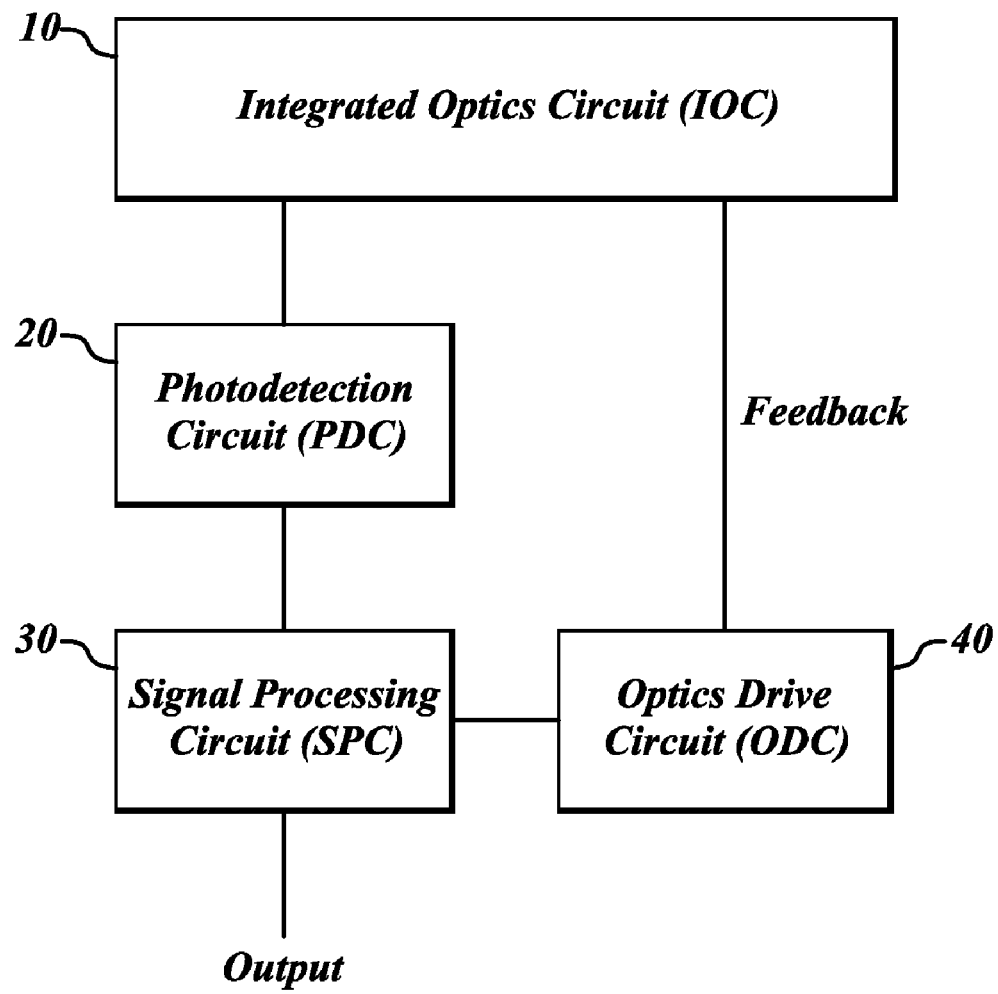
FIG. 1 illustrates a block diagram of a closed loop fiber optic gyro formed in accordance with an embodiment of the present invention.

FIG. 1 illustrates a closed-loop architecture of an optical sensor 8 formed in accordance with an embodiment of the present invention. The closed-loop sensor 8 includes an integrated optics circuit (IOC) 10, a photodetection circuit (PDC) 20, a signal processing circuit (SPC) 30, and an optics drive circuit (ODC) 40. The closed loop optical sensor 8 may be one of any number of different types of closed-loop sensors, for example, closed-loop fiber optic sensors and gyros.

When the optical sensor 8 is implemented as a closed-loop fiber optic gyro, the sensor 8 measures an angular velocity or a velocity about a particular axis of rotation by determining a difference in phase between two beams of light travelling in opposite directions (e.g., clockwise and counterclockwise directions) around the fiber optic coils of the IOC 10. The analog optical output of the IOC 10 is communicated to the PDC 20, wherein the analog optical output is amplified and converted to digital phase shift data. The digital phase shift data of the PDC 20 is then communicated to the SPC 30 of the gyro, where it is demodulated, detected, and communicated to the ODC 40. The ODC 40 then converts the demodulated digital phase shift data to analog form, amplifies the analog data, and then communicates the amplified analog data to the IOC 10 through a feedback loop.

The bit resolution measured by a fiber optic gyro can be as high as 23 bits, prior to data conversion and subsequent signal processing. For example, traditional nonsegmented IOC drives measure a phase shift at a 23 bit resolution and then degrade this resolution to below 16 bits during a truncation processing step, which occurs in the SPC 30. In these systems, bit data is truncated before being communicated to a single high resolution DAC in the ODC 40. This truncation can cause an error with a magnitude as high as one half of the least significant bit (LSB) of data. When the loop of the gyro attempts to correct for this one half LSB data error, it can only increase or decrease the bit resolution by one LSB, which incorrectly changes the sign of an error.

In contrast, the SPC 30 of the present invention does not require such a truncation processing step and removes the one half LSB data error associated with traditional nonsegmented IOC drives. The SPC 30 of the present invention segments 23 bit data into a Most Significant Bit (MSB) data portion (typically ranging between 10 to 14 bits in length) and a LSB data portion (comprising the remaining bit resolution) for processing at parallel Digital to Analog Converters (DAC) in the ODC 40. In accordance with an alternate embodiment of the present invention the MSB/LSB data segmentation occurs at the ODC 40 instead of at the SPC 30. The parallel DACs of the ODC 40 then convert the 23 bits of segmented MSB/LSB data to analog signal data and then amplify and combine this high precision signal data to drive the IOC 10. In accordance with an embodiment of the present invention, the combination of analog signal data occurs before the amplification step.

Figure 2:
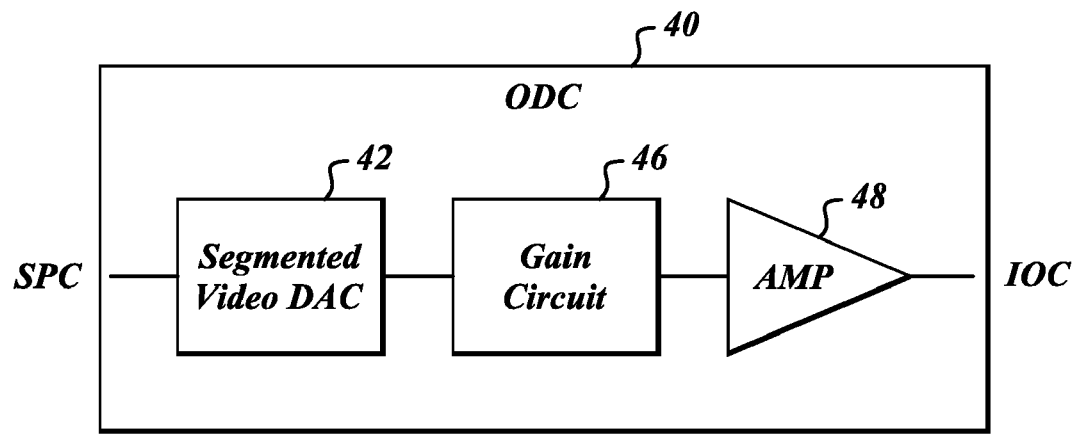
FIG. 2 illustrates a block diagram of an IOC drive component formed in accordance with an embodiment of the present invention.

FIG. 2 illustrates the ODC 40 formed in accordance with an embodiment of the present invention. The ODC 40 includes a segmented video DAC (SVDAC) 42, a gain circuit 46, and an amplifier component 48. The SVDAC 42 receives data representing a 23 bit digital signal from the SPC 30. This signal is segmented into a MSB component and a LSB component and then converted to an analog signal by the SVDAC 42. After conversion processing, a gain is applied to the analog MSB and LSB signal components utilizing the gain circuit 46. After gain processing the analog signals are combined by the amplifier 48 and output the IOC 10. In accordance with an alternate embodiment of the present invention, gain is applied after the analog signals are combined by the amplifier 48, prior to outputting the analog signal to the IOC 10. In accordance with another embodiment the gain processing could comprise either electrical or optical gain processing.

Figure 3:
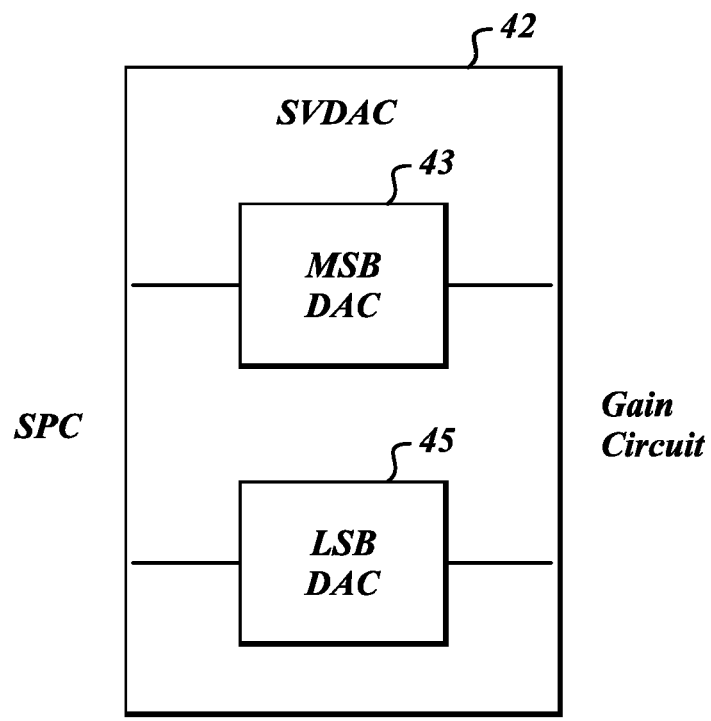
FIG. 3 illustrates a block diagram of a segmented DAC component in an IOC drive formed in accordance with an embodiment of the present invention.

The contents of the SVDAC 42 are illustrated in FIG. 3. The SVDAC 42 includes a MSB DAC 43 and a LSB DAC 45. The MSB DAC 43 receives and converts the most significant bits of data segmented from a 23 bit data signal and the LSB DAC 45 receives and converts the least significant bits of data segmented from the same 23 bit signal. In accordance with an embodiment of the invention the MSB/LSB data segmentation occurs at the SPC 30, and in accordance with an alternate embodiment the data segmentation occurs within the ODC 40. In one embodiment, after conversion processing of both the MSB and LSB DACs, the segmented analog signals are output to the gain circuit 46, illustratively depicted in FIG. 4. In an alternate embodiment the segmented analog signals are output to the amplifier 48.

Figure 4:
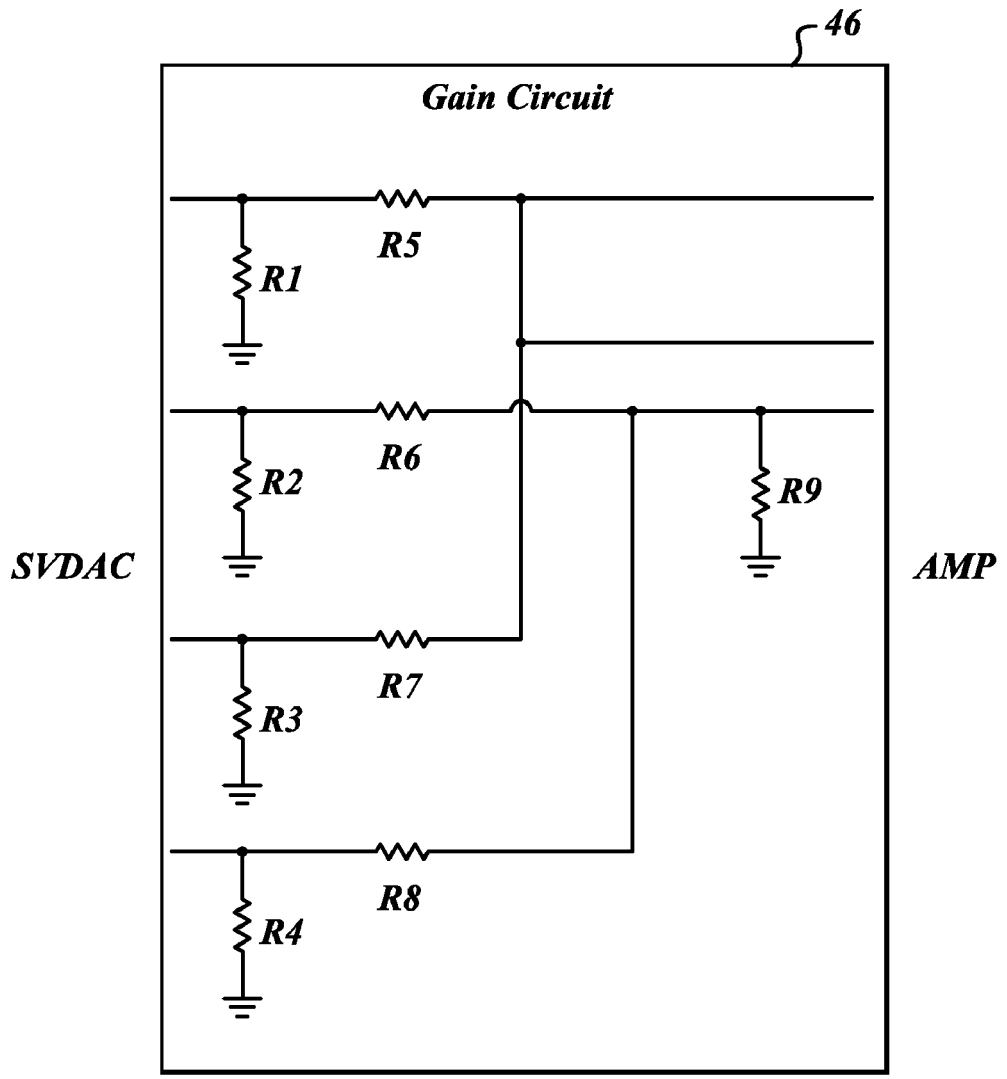
FIG. 4 illustrates a gain circuit in an IOC drive formed in accordance with an embodiment of the present invention.

FIG. 4 illustrates a gain circuit 46 in accordance with an embodiment of the present invention. The gain circuit includes an MSB passive portion including passive circuit elements R1, R2, R5, R6 and R9 and an LSB passive portion including passive circuit elements R3, R4, R7, R8 and R9. The MSB passive circuit elements are configuratively selected to facilitate a large signal gain (e.g., a Gain=3.0) to an MSB analog output of the MSB DAC 43. The LSB passive circuit elements are configuratively selected to facilitate a much smaller signal gain (e.g., a Gain=0.003) to the LSB analog output from the LSB DAC 45. Both the MSB and LSB signals are output from the gain circuit 46 to the amplifier 48, where they are combined into one high precision analog signal (of 23 bit precision).

Figure 5:
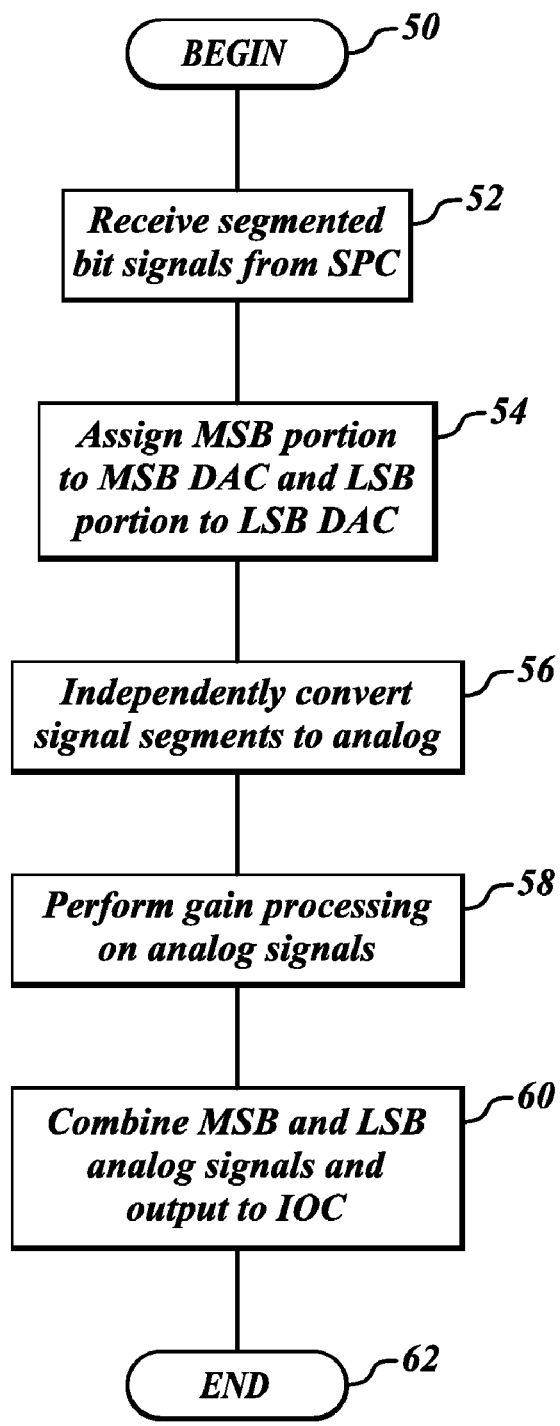
FIG. 5 illustrates a flow diagram of a process associated with an IOC drive formed in accordance with an embodiment of the present invention.

FIG. 5 illustrates a flow diagram of a process performed by the ODC 40, in accordance with an embodiment of the present invention. The process begins at a block 50 after a 23 bit digital data signal is processed by the SPC 30 and segmented into a MSB and a LSB portion. At a block 52, the ODC 40 receives the segmented bit signal data from the SPC 30. Next at a block 54 the SVDAC 42 assigns the MSB data to the MSB DAC 43 and the LSB data to the LSB DAC 45, for conversion processing at a block 56. During this conversion processing, the MSB DAC 43 and the LSB DAC 45 independently convert the segmented digital signals to analog signals. Then at a block 58, a gain processing is performed at the gain circuit 46, which facilitates a large gain of the MSB analog data and a smaller gain of the LSB analog data. At a block 60 the MSB and LSB analog data are combined into a high precision analog signal which is used to drive the IOC 10. At a block 62, the drive processing ends.

While several embodiments of the present invention have been illustrated and described herein, many changes can be made without departing from the spirit and scope of the invention. Accordingly, the scope of the invention is not limited by any disclosed embodiment. Instead, the scope of the invention should be determined from the appended claims that follow.

The embodiments of the invention in which an exclusive property or privilege is claimed are defined as follows:

1. An optical sensor system comprising:
   an optics circuit configured to generate analog measurement data;
   a detector circuit configured to detect the analog measurement data and to convert the analog measurement data to a digital measurement data;
   a signal processing circuit configured to demodulate the digital measurement data and to generate a digital signal based on the demodulated digital measurement data; and
   an optics drive circuit configured to generate an analog drive signal based on the digital signal, wherein the analog drive signal is used to drive the optical circuit;
   wherein the optics drive circuit comprises a first converter configured to convert a first digital data segment of the digital signal to a first analog data segment and a second converter configured to convert a second digital data segment of the digital signal to a second analog data segment;
   wherein the optics drive circuit is further configured to amplify the first and second analog data segments, combine the amplified analog data segments into a single analog drive signal, and feeds said single analog drive signal into the optics circuit to control modulation of light in said optical circuit.

2. The system of claim 1, wherein conversion of the first and second digital data segments at the first and second converters occurs in parallel.

3. The system of claim 1, wherein the first digital data segment corresponds to more significant bits of data than the second digital data segment.

4. The system of claim 1, wherein the generated analog drive signal of the optical drive circuit has greater than 16 bit resolution.

5. The system of claim 1, wherein the generated digital measurement data and the analog drive signal correspond to data with at least 23 bit resolution.

6. A method for improving output resolution of an optical drive circuit in an optical sensor, the method comprising:
   receiving an analog measurement data from an optical circuit;
   converting the received analog measurement data to a digital measurement data;
   generating a segmented digital signal based on the digital measurement data, wherein the segmented digital signal contains first and second digital data segments;
   converting the first digital data segment into a first analog data segment and converting the second digital data segment into a second analog data segment;
   amplifying in the first analog data segment and second analog data segment; and
   generating a combined analog drive signal based on the first analog segment and the second analog segment, wherein the combined analog drive signal is fed into the optical circuit to control modulation of light in said optical circuit.

7. The method of claim 6, wherein the first digital data segment corresponds to more significant bits of data than the second digital data segment.

8. The method of claim 6, wherein the combined analog drive signal has greater than 16 bit resolution.

9. The method of claim 6, wherein the generated digital measurement data and the analog drive signal correspond to data with at least 23 bit resolution.

10. A system for improving output resolution of an optical drive component in an optical sensor circuit, the system comprising:
    means for receiving an analog measurement data from an optical circuit;
    means for converting the received analog measurement data to a digital measurement data;
    means for generating a segmented digital signal based on the digital measurement data; and
    means for generating an analog drive signal based on the segmented digital signal, wherein the analog drive signal is used to drive the optical circuit;
    means for segmenting the digital measurement data into a first digital data segment
    and a second digital data segment;
    means for converting the first digital data segment into a first analog data segment;
    means for converting the second digital data segment into a second analog data segment;
    means for amplifying the first and second analog data segments and then combining the amplified analog data segments into a single analog drive signal; and
    means for feeding the single analog drive signal into the optics circuit to control modulation of light in the optical circuit.

* * * * *